US008683674B2

(12) United States Patent
Di Stefano

(10) Patent No.: US 8,683,674 B2
(45) Date of Patent: Apr. 1, 2014

(54) METHOD FOR STACKING MICROELECTRONIC DEVICES

(75) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 216 days.

(21) Appl. No.: 13/311,892

(22) Filed: Dec. 6, 2011

(65) Prior Publication Data

US 2012/0137512 A1    Jun. 7, 2012

Related U.S. Application Data

(60) Provisional application No. 61/420,765, filed on Dec. 7, 2010.

(51) Int. Cl.
*H02K 15/00* (2006.01)
*H02K 15/14* (2006.01)
*H02K 15/16* (2006.01)

(52) U.S. Cl.
USPC .......... 29/596; 29/831; 29/841; 29/852; 29/854; 73/159; 73/204.11; 73/204.22; 438/119; 438/455; 438/458; 438/459

(58) Field of Classification Search
USPC .......... 29/426.1, 428, 469, 592.1, 602.1, 29/830–832, 846, 871, 881; 206/701, 706, 206/707, 710, 716, 724, 725; 439/66, 439/70–74, 330, 331, 374, 525, 526, 691, 439/630, 876
See application file for complete search history.

(56) References Cited

U.S. PATENT DOCUMENTS

| | | | |
|---|---|---|---|
| 4,345,810 A | | 8/1982 | Bakermans |
| 4,681,221 A | * | 7/1987 | Chickanosky et al. ........ 206/719 |
| 4,881,639 A | | 11/1989 | Matsuoka et al. |
| 5,066,245 A | * | 11/1991 | Walker .......................... 439/526 |
| 5,140,405 A | | 8/1992 | King et al. |
| 5,161,983 A | | 11/1992 | Ohno et al. |
| 5,221,209 A | | 6/1993 | D'Amico |
| 5,344,334 A | | 9/1994 | Laub et al. |
| 5,494,169 A | | 2/1996 | Matsuoka |
| 5,518,410 A | | 5/1996 | Masaini |
| 5,713,744 A | | 2/1998 | Laub |
| 5,758,776 A | | 6/1998 | Slocum et al. |
| 5,781,021 A | | 7/1998 | Ilani |
| 5,801,452 A | | 9/1998 | Farnworth et al. |
| 5,918,746 A | * | 7/1999 | Tokita et al. .................. 206/716 |
| 5,957,293 A | | 9/1999 | Pakeriasamy |
| 6,132,220 A | | 10/2000 | McHugh et al. |

(Continued)

FOREIGN PATENT DOCUMENTS

| | | |
|---|---|---|
| EP | 0220600 A2 | 5/1987 |
| WO | 2009/100910 A1 | 8/2009 |

*Primary Examiner* — Paul D Kim
(74) *Attorney, Agent, or Firm* — Michael B. Einschlag

(57) ABSTRACT

Method for stacking microelectronic devices using two or more carriers, each holding microelectronic devices in an array so they may be registered. Each device is releasably held by its edges in a carrier to allow access to top and bottom surfaces of the device for joining. Arrays of devices held in two or more carriers are juxtaposed and joined to form an array of stacked devices. A resulting stacked device is released from the juxtaposed carriers holding each device by releasing forces of the corresponding carrier urging upon edges of the device, thereby permitting removal of the stacked device.

8 Claims, 7 Drawing Sheets

(56) References Cited

U.S. PATENT DOCUMENTS

| | | | |
|---|---|---|---|
| 6,179,127 B1 | 1/2001 | Kato et al. | |
| 6,196,849 B1 | 3/2001 | Goodwin | |
| 6,227,372 B1 | 5/2001 | Thomas et al. | |
| 6,242,933 B1 | 6/2001 | Yap | |
| 6,357,503 B1 * | 3/2002 | Kromer et al. | 156/351 |
| 6,377,062 B1 | 4/2002 | Ramos et al. | |
| 6,474,477 B1 | 11/2002 | Chang | |
| 6,535,007 B2 | 3/2003 | Haas et al. | |
| 6,627,483 B2 | 9/2003 | Ondricek et al. | |
| 6,644,981 B2 | 11/2003 | Choy | |
| 6,696,849 B2 | 2/2004 | Ban et al. | |
| 6,699,047 B1 | 3/2004 | McHugh et al. | |
| 6,762,611 B2 | 7/2004 | Hubner et al. | |
| 6,848,936 B2 | 2/2005 | DeFord | |
| 6,864,568 B2 | 3/2005 | Kohno et al. | |
| 6,877,993 B2 | 4/2005 | Palaniappa et al. | |
| 6,929,505 B2 | 8/2005 | He et al. | |
| 7,118,385 B1 | 10/2006 | Bodenweber et al. | |
| 7,258,703 B2 * | 8/2007 | Cheng et al. | 29/25.01 |
| D589,010 S | 3/2009 | Di Stefano | |
| D589,011 S | 3/2009 | Di Stefano | |
| 7,510,402 B2 | 3/2009 | Ma et al. | |
| 7,842,546 B2 * | 11/2010 | Tang | 438/106 |
| 2002/0057963 A1 | 5/2002 | Peterson et al. | |
| 2004/0155646 A1 | 8/2004 | Hoppe | |
| 2005/0196982 A1 | 9/2005 | Cao et al. | |
| 2006/0071656 A1 | 4/2006 | Joung et al. | |
| 2008/0252330 A1 | 10/2008 | Hart et al. | |
| 2010/0206768 A1 | 8/2010 | Hoffmann et al. | |

* cited by examiner

METHOD FOR STACKING MICROELECTRONIC DEVICES

This patent application relates to U.S. Provisional Application No. 61/420,765 filed Dec. 7, 2010 from which priority is claimed under 35 USC §119(e), and which provisional application is incorporated herein in its entirety.

CROSS-REFERENCE TO RELATED APPLICATIONS

This application is related to the following applications which are owned by the assignee of this application, and both of which applications are incorporated by reference herein in their entireties: (a) a related application entitled "Method and Apparatus for Holding Microelectronic Devices," which related application has application Ser. No. 12/535,519 and was filed on Aug. 4, 2010; and (b) a related application entitled "Precision Carrier for Microelectronic Devices," which related application was filed the same day this application was filed.

TECHNICAL FIELD

One or more embodiments of the present invention relate to releasably holding arrays of devices such as, for example and without limitation, microelectronic devices, in precision carriers to enable precise registration of arrays of devices in juxtaposition to one or more corresponding arrays of devices so that corresponding devices so juxtaposed may be joined into one stacked unit.

BACKGROUND

Semiconductor processing is an increasingly complex and mature technology for which the cost of test and burn-in consumes an ever larger share of production costs. Continuous progress is being made in semiconductor technology and wafer fabrication efficiency, such progress being characterized by Moore's law which has successfully predicted a doubling of the number of devices on a semiconductor chip every two years. Productivity gains from advances in semiconductor technology and wafer fabrication efficiency underlie the modern economy, making possible mobile electronics, internet communications and much of modern life. However, semiconductor packaging and testing have not maintained the same pace of technological progress.

Methods commonly used for contacting individual, separated semiconductor chips during testing have remained largely the same for decades. For example, after wafer probe testing, a wafer is sawn apart into individual chips. Additional packaging steps may be used to protect the chip and facilitate its attachment into an electronic system. After packaging, each chip is inserted into a first socket to test for opens and shorts before burn-in. Each chip is then released from the first socket and transported in a tray. In an optional next step, the chip is inserted into a second (burn-in) socket and burned-in for eight hours at an elevated temperature of about 125° C. After burn-in, the chip is removed from the burn-in socket and transported in a tray to "final test" where it is inserted into a third socket. A comprehensive set of tests is done in final test, which tests are typically done at several speeds and temperatures. The socketing, sockets, fixtures, test boards and handling involved with the process of testing individual chips and other microelectronic devices is an increasing problem in streamlining the production of semiconductor devices.

After appropriate burn-in and test, devices may be juxtaposed and joined together in a stack to form a compact microelectronic device. Handling, testing and joining bare semiconductor chips has proven to be difficult. Alignment of individual devices to an accuracy suitable for contacting and joining at elevated temperatures is a barrier to efficient stacking of complex devices that require extensive testing. One approach to the problem is to burn-in and test chips in wafer form before singulation into individual dice; the tested wafers are then stacked in registration, joined together and diced into individual stacked devices. Full wafer stacking suffers from an inefficiency in that a wafer typically contains a significant percentage of defective chips that, when joined with other chips into a stack, cause the entire stack to be defective. A more effective way is needed to handle and align individual chips so that only known good dice (KGD) are stacked to form a fully functioning microelectronic device.

Another approach involves placing chips, whether packaged or not, in an accurately positioned array on a carrier for purposes of testing. To provide accurate placement of chips on the carrier (accurate placement is needed for registering terminals on the chips to mating contactors), each chip must be loaded onto the carrier precisely. Accurate registration ensures that pads of a device reliably and repeatedly contact corresponding pads of the tester. After fully testing the chip, it must be removed from the carrier and placed in accurate juxtaposition to other chips to be joined into a stacked device. More efficient methods for handling, testing and aligning chips for joining is needed for the advancement of the semiconductor art to higher density electronics.

SUMMARY

A method is provided for handling, testing and stacking microelectronic devices, for example and without limitation, bare dice, by using two or more carriers, each holding microelectronic devices in an array so they may be registered accurately, as needed for testing and stacking the devices. Each device is releasably held by its edges in a carrier to allow access to top and bottom surfaces of the device for joining without impediment. Arrays of devices held in two or more carriers are juxtaposed and joined to form an array of stacks of devices. The resulting stack is released from the juxtaposed carriers holding each device, respectively, by releasing the forces applied by the corresponding carrier that urge upon edges of the device, thereby permitting removal of the stacked device.

DETAILED DESCRIPTION

In accordance with one or more embodiments, a carrier (also referred to herein as a tray) is provided for releasably holding devices, for example and without limitation, microelectronic devices, in place so that the devices may be moved to a socket, for example and without limitation, a test socket, and so that the devices may be aligned with mating contactors, for example and without limitation, test contactors (for example, an electrode terminal of a socket), in the socket, for example and without limitation, the test socket.

As used herein, the term device is used in the broadest sense and includes, without limitation, an electronic device and a microelectronic device including a semiconductor chip, a flip chip, a packaged electronic circuit, a hybrid circuit, a daughter card, a multi-chip module, and the like. As further non-limiting examples of the types of microelectronic devices which may be held in a carrier fabricated in accordance with one or more embodiments are BGAs (as used herein the term BGA, or ball grid array, is a two dimensional array of solder bump terminals on a microelectronic device), CSPs (as used herein, the term CSP is a chip scale package), flip-chips, wafer level packages (WLPs), bare semiconductor dice, MEMS, sensor devices, LED devices, and multi-chip modules.

Figure 1A:
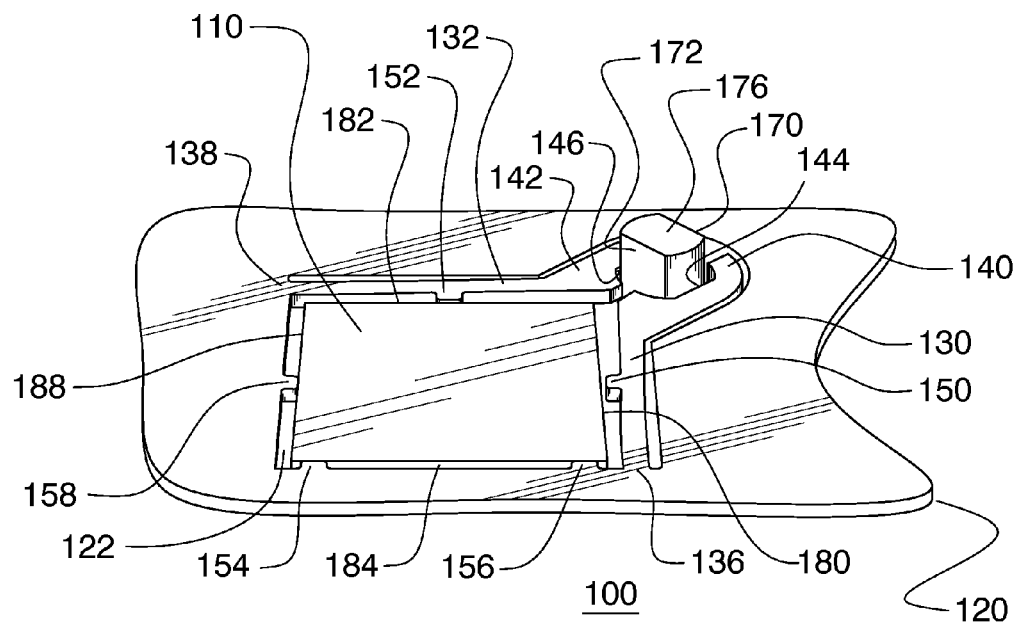
FIGS. 1A and 1B are perspective views of a site in a carrier for holding microelectronic devices that is fabricated in accordance with one or more embodiments, the site being shown in an open and in a closed configuration, respectively.
Figure 1B:
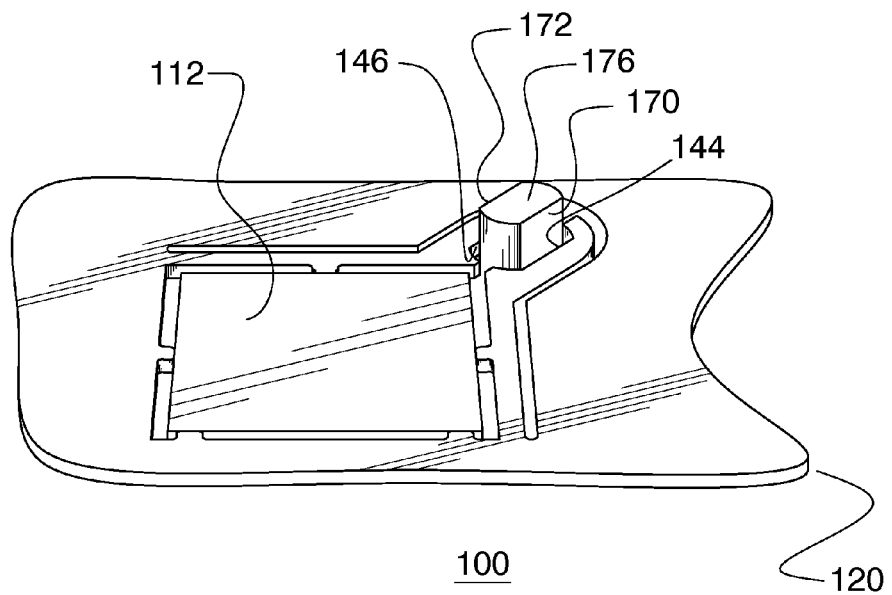
Figure 2A:
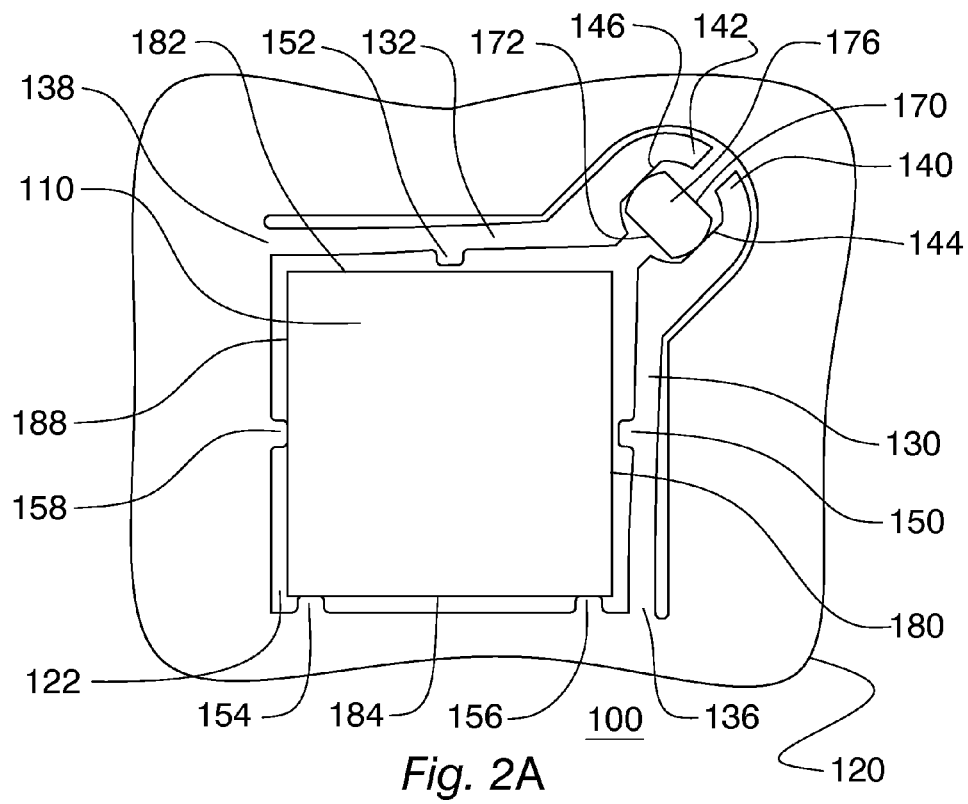
FIGS. 2A and 2B are top views of the site in a carrier for holding microelectronic devices shown in FIGS. 1A and 1B.
Figure 2B:
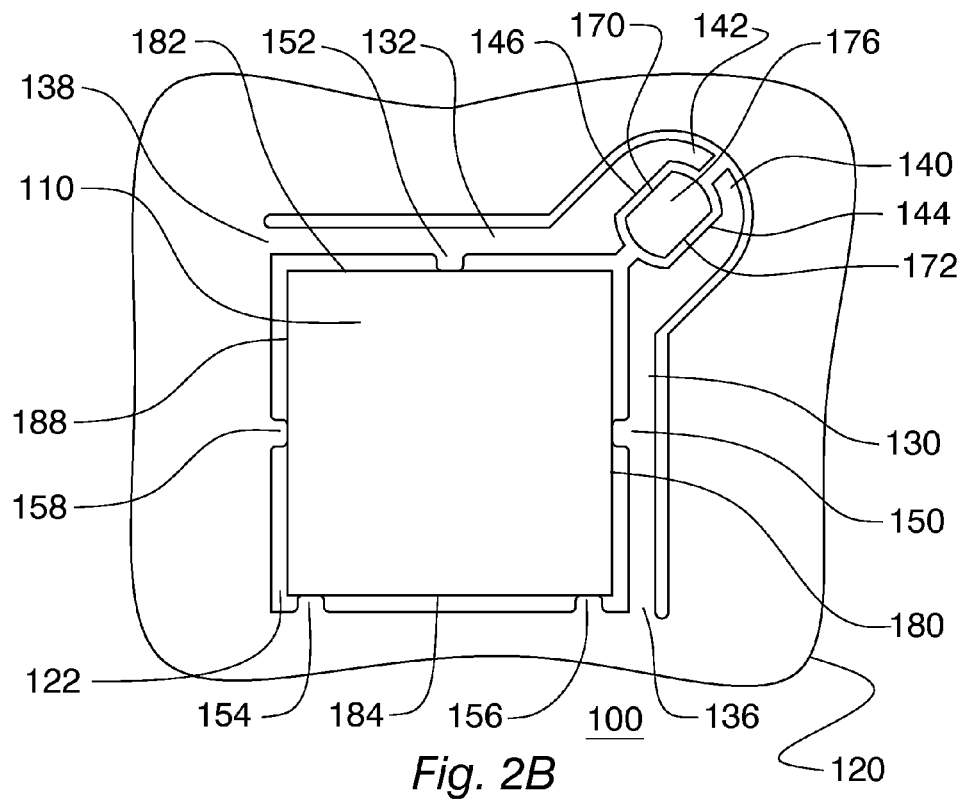

In accordance with one or more embodiments, a carrier comprises one or more sites arrayed in a planar body. As used herein, a site is a location within a carrier for one device. FIGS. 1A and 1B are perspective views of site 100 in a carrier for holding microelectronic devices that is fabricated in accordance with one or more embodiments, site 100 being shown in an open and in a closed configuration, respectively; and FIGS. 2A and 2B are top views of site 100, site 100 being shown in an open and in a closed configuration, respectively. As used herein, the expression "respectively" means that a first item in a first list relates to a first item in a second list; a second item in the first list relates to a second item in the second list; and so forth.

As shown in FIGS. 1A and 2A, site 100 includes resilient aperture 122 in planar body 120, where aperture 122 is shaped to receive semiconductor chip 110. As further shown in FIGS. 1A and 2A, site 100 comprises resilient, elongated prongs 130 and 132 that are attached at ends 136 and 138, respectively, to planar body 120 (ends 136 and 138 may also be referred to herein as fixed ends or proximal ends). In accordance with one or more embodiments, a prong is a spring element (i.e., a resilient element) that acts in a plane of planar body 120 to position and retain a microelectronic device in place in the carrier as described below. In accordance with one or more such embodiments, prongs 130 and 132 are attached at ends 136 and 138, respectively, so that prongs 130 and 132 may be flexed in a direction away from a center of aperture 122. Prongs 130 and 132 are movable in a plane, for example, in the plane of planar body 120, so as to increase the area enclosed by aperture 122. Free ends 140 and 142 of prongs 130 and 132, respectively, extend away from aperture 122 and are movable in a plane, for example, in the plane of planar body 120 (free ends 140 and 142 may also be referred to herein as distal ends or engagement mechanisms). In accordance with one or more embodiments, each of free ends 140 and 142 may be resiliently connected by a spring-like member to body 120 or to the corresponding opposite free end. In accordance with one or more embodiments, free end 140 of prong 130 extends beyond a portion of prong 130 (also referred to herein as a prong body) that may hold a device in the manner described below, and free end 142 of prong 132 extends beyond a portion of prong 132 (also referred to herein as a prong body) that may hold a device in the manner described below. Further, at least a portion of edge 144 of free end 140 (an actuating edge) is juxtaposed to at least a portion of edge 146 of free end 142 (an actuating edge). As further shown in FIGS. 1A and 2A, at least a portion of free ends 140 and 142 extend into an aperture in planar body 120 that extends outside aperture 122. As still further shown in FIGS. 1A and 2A, actuating edges 144 and 146 of free ends 140 and 142, respectively, are juxtaposed with each other, and there is a space between them that permits insertion of cam 176 therebetween. As shown in FIGS. 1A and 2A, actuating edges 144 and 146 are in the shape of a "C". However, one of ordinary skill in the art should understand that further embodiments exist that are not limited to this particular shape.

As further shown in FIGS. 1A and 2A, in accordance with one or more embodiments, prong 130 includes lateral boss 150 (i.e., a protrusion that is a part of an edge of the prong body of prong 130, also referred to herein as a contactor edge) that is adapted to bear against edge 180 of chip 110, thereby urging edge 188 of chip 110 against lateral boss 158 in an opposite wall of aperture 122 (where lateral boss 158 is a protrusion that is a part of an edge of the wall, also referred to herein as a contactor edge). Similarly, and as further shown in FIGS. 1A and 2A, prong 132 includes lateral boss 152 (i.e., a protrusion that is a part of an edge of the prong body of prong 132, also referred to herein as a contactor edge) that is adapted to bear against edge 182 of chip 110, thereby urging edge 184 of chip 110 against lateral bosses 154 and 156 in an opposite wall of aperture 122 (where lateral bosses 154 and 156 are protrusions that are a part of an edge of the wall, also referred to herein as a contactor edge). One of ordinary skill in the art can readily appreciate that: (a) lateral boss 150 disposed on an edge of the body of prong 130 represents a portion of an edge of the body of prong 130; (b) lateral boss 152 disposed on an edge of the body of a prong 132 represents a portion of an edge of the body of prong 132; (c) lateral boss 158 disposed on an edge of a wall of aperture 122 represents a portion (for example, a fixed portion) of an edge of the wall of aperture 122; and (d) lateral bosses 154 and 156 disposed on an edge of a second wall of aperture 122 represent a portion (for example, a fixed portion) of an edge of the second wall of aperture 122. One of ordinary skill in the art should appreciate that further embodiments may be fabricated where prongs 130 and 132 do not have lateral bosses or where prongs 130 and 132 have more than one lateral boss, or that the one or more lateral bosses are resilient, for example without limitation, resilient flat springs. In addition, one of ordinary skill in the art should also appreciate that further embodiments may be fabricated where one or more walls of aperture 122 do not have lateral bosses or where one or more walls of aperture 122 have one lateral boss or have more than two lateral bosses, or that the one or more lateral bosses are resilient, for example without limitation, resilient flat springs.

As further shown in FIGS. 1A and 2A, in accordance with one or more such embodiments, cam 176 may be inserted between free ends 140 and 142 of prongs 130 and 132, respectively. As used herein, (a) an open configuration of a site is a configuration where free ends 140 and 142 of prongs 130 and 132, respectively, are separated enough, and therefore, prongs 130 and 132, respectively, are separated enough, so that a device is free to be inserted into or removed from aperture 122 of the carrier; and (b) a closed configuration of the site is a configuration where the prongs are released so that free ends 140 and 142 can resiliently relax enough so that the device may be held in position in the site on the carrier. As used herein, a cam is a mechanical element used to urge free ends 140 and 142 of adjacent prongs 130 and 132, respectively, apart, thereby opening aperture 122 in the carrier.

FIGS. 1A and 2A show site 100 in an open configuration wherein chip 110 may be inserted into or withdrawn from aperture 122. As shown in FIGS. 1A and 2A, in the open configuration, lateral bosses 150 and 152 in prongs 130 and 132, respectively, are drawn away from chip 110 by actuation of cam 176 whereby free ends 140 and 142 of prongs 130 and 132, respectively, are urged apart. In accordance with one or more embodiments, actuation of cam 176 is accomplished by rotating rotatable cam 176 about its axis (using any one of a number of methods that are well known to those of ordinary skill in the art) to urge the cylindrical surface of cam 176 against lateral faces 144 and 146 (i.e., edges) of free ends 140 and 142 of prongs 130 and 132, respectively. Rotating cam 176 forces free ends 140 and 142 of prongs 130 and 132, respectively, apart, thereby flexing prongs 130 and 132 to cause them to move apart in the plane of planar body 120, and away from the center of aperture 122, thereby moving lateral bosses 150 and 152 away from edges 180 and 182, respectively, of chip 110. In the open configuration, bosses 150 and 152 are retracted away from edges 180 and 182 of chip 110, respectively, allowing chip 110 to be placed into, and removed from, aperture 122. As shown in FIG. 2A, in accordance with one or more embodiments, free ends 140 and 142 have been fabricated to provide a chamber within which cam 176 may be inserted. As further shown in FIGS. 2A and 2B, the chamber is configured so that cam 176 may be disposed in a: (a) first orientation where prongs 130 and 132 are enabled to resiliently relax sufficiently for them to be able to hold chip 110; and (b) second orientation where cam 176 urges free ends 140 and 142 apart.

FIGS. 1B and 2B show site 100 in a closed configuration wherein chip 110 is held in accurate registration with respect to the carrier such that the carrier and chip 110 may be transported, stored or loaded onto a socket contactor without losing registration. As used herein, registration means alignment of terminal pads on a microelectronic device to contactors of a mating socket. Site 100 is placed in the closed configuration by rotating rotatable cam 176 about its axis (using any one of a number of methods that are well known to those of ordinary skill in the art) so that cylindrical surfaces of cam 176 disengage from lateral faces 144 and 146 of prong free ends 140 and 142, respectively, thereby allowing prong free ends 140 and 142 to move in the plane of body 120 resiliently toward one another. As such, elongated prongs 130 and 132 relax resiliently in the plane of body 120, and move toward the center of aperture 122, thereby urging lateral bosses 150 and 152 against edges 180 and 182 of chip 110, respectively. Chip 110 is held between lateral boss 150, which resiliently urges upon edge 180, and opposing lateral boss 158 which, in reaction, urges upon edge 188. In addition, in another direction in the plane of body 120, chip 110 is held between lateral boss 152, which urges upon edge 182, and opposing lateral bosses 154 and 156 which, in reaction, urge upon edge 184. As one of ordinary skill in the art can readily appreciate from this, chip 110 is oriented into registration by action of lateral bosses 150 and 152 urging chip 110 into mechanical contact with opposing bosses: (a) lateral boss 158 mechanically contacts edge 188; (b) lateral boss 154 mechanically contacts edge 184; and (c) lateral boss 156 mechanically contacts edge 184. In addition to accurate registration, urging of lateral bosses 150 and 152, and, in reaction, urging of bosses 154, 156 and 158 against chip 110, holds chip 110 securely in place within aperture 122 and prevents chip 110 from falling out of carrier site 100.

In accordance with one or more embodiments, aperture 122 may extend through planar body 120, thereby allowing access to top surface 112 of chip 110 for direct chip cooling, while allowing access to a bottom surface of chip 110 for connection to contactor probes of a test socket. Alternatively, aperture 122 may have a bottom structure so that chip 110 is prevented from falling downward and out of aperture 122 when aperture 122 is opened. In accordance with one or more embodiments, the bottom structure may comprise tabs or a sheet of material with or without apertures therein. In accordance with one or more such embodiments, the bottom structure comprises a thin sheet of copper, copper alloy, steel, polyimide, or other suitable material. In accordance with yet further embodiments, the bottom structure comprises a thin sheet with embedded contactors disposed through the sheet whereby electrical connections may be made between terminals on bottom side of chip 110 and corresponding terminals of a mating socket. Embedded contactors include without limitation terminals with roughened surfaces, spring probes, resilient metal vias, cantilever probes, buckling beam probes, flat spring probes, and the like.

In accordance with one or more embodiments, planar body 120 may be made of a sheet of full hardness tempered 301 stainless steel having, for example and without limitation, a thickness of 0.25 mm. In accordance with one or more such embodiments, the features of site 100 that are shown in FIGS. 1A to 2B and described above may be laser cut in a full hardness tempered 301 stainless steel sheet to an accuracy of +/−5 micrometers; elongated prongs 130 and 132 may be approximately 0.5 mm wide; end edge faces 144 and 146 of prongs 130 and 132 may be parallel and may be separated by a 1.0 mm spacing when holding a device; and body 120 may be coated with a thin dielectric film, for example and without limitation, of e-coat electrodeposited coating that is available from "Pittsburgh Plate Glass," i.e., PPG Industries, Inc. of Pittsburgh, Pa. In accordance with one or more embodiments, a carrier may comprise one or more sites like site 100 that are arranged in an array on a planar body 120. As used herein, an array is an ordered assembly of sites positioned, for example and without limitation, for testing purposes. In accordance with one or more alternative embodiments, carrier body 120 may be made of a material such as, for example and without limitation, stainless steel, tempered steel, Monel 500, glass fiber reinforced polyimide, Aramid fiber reinforced polyimide (available from Arlon, Inc. of Santa Ana, Calif.), NiTi shape memory alloy (available from National Electronic Alloys, Inc. of Santa Ana, Calif.), carbon fiber reinforced polymer, or a resilient plastic material.

In accordance with one or more embodiments, cam 176 may be formed from a stainless steel cylinder having, for example and without limitation, a diameter of 1.25 mm by flattening it on two sides to form flat faces 170 and 172. To insert cam 176 at site 100, cam 176 is first oriented so that flat faces 170 and 172 are parallel to edge faces 144 and 146 of prongs 130 and 132, respectively. Then, cam 176 is inserted into a gap between edge faces 144 and 146. In accordance with one or more embodiments, site 100 is opened by rotating cam 176 by 90° from the cam orientation shown in FIGS. 1B and 2B to the cam orientation shown in FIGS. 1A and 2A. The rotational movement of cam 176 urges edge faces 144 and 146 apart, thereby spreading prongs 130 and 132 to release chip 110. While rotational motion of cam 176 is preferred, other cam motions are useful for opening the apertures in a carrier fabricated in accordance with one or more embodiments. In particular, any one of a number of open-close mechanisms would be useful where the open-close mechanism, in a first position or orientation, moves free ends 140 and 142 apart to place aperture 122 in an open configuration; and, in a second position or orientation, allows free ends 140 and 142 to move together to place aperture 122 in a closed configuration. In addition, and more generally, an open-close mechanism is an apparatus that, in a first position or orientation, causes prongs 130 and 132 to flex so that the area of the aperture is increased, whereby a microelectronic device may be inserted into or released from the aperture, and, in a second position or orientation, allows prongs 130 and 132 to relax so that the area of the aperture is decreased, whereby the microelectronic device may be held in the aperture by the springs urging against edges of the device.

While a carrier which is fabricated to have a multiplicity of sites like site 100 shown in FIGS. 1A and 2A is substantially planar, it will be understood by one of ordinary skill in the art that carriers fabricated in accordance with one or more embodiments may include additional features that facilitate loading and unloading of various types of microelectronic devices. By way of example and not limitation, a beveled frame may be added to planar body 120 to guide devices into apertures like aperture 122. In accordance with one or more such embodiments, the beveled frame may be formed individually, i.e., with one frame per site, or beveled frames may be formed in an array that is attached to planar body 120. As used herein, a frame may be a "picture frame," typically fabricated from molded plastic material, which frame is used to guide a device into an aperture in the carrier. In accordance with one or more such embodiments, a beveled frame may be fabricated using any one of a number of conventionally practiced methods of plastic molding. Suitable plastics for fabricating beveled frames include, for example and without limitation, FR-4 epoxy, liquid crystal polymer, polyether ether ketone (PEEK), polyether sulfone (PES), and polyamide-imide (Torlon® available from Quadrant Engineering Plastics of Reading, Pa.).

In accordance with one or more further embodiments, body 120 of a carrier may be stamped, or otherwise formed, to include alignment features, orientation features, stops, stacking elements, bottom stops and the like, that facilitate the use of carriers across a wide spectrum of applications (see further description below). In addition, and in accordance with one or more embodiments, the thickness of body 120 may be adapted to the devices being held in the carrier (note that in accordance with various embodiments, at some or all sites, the device may be thicker than the body, and in accordance with other embodiments, the body may be thicker than the device). For example and without limitation, the thickness of the body may range from a thin sheet of about 0.1 mm in thickness for use in a flip chip application to a molded plastic sheet of about 5 mm in thickness for use with a MEMS pressure sensor device.

Figure 3A:
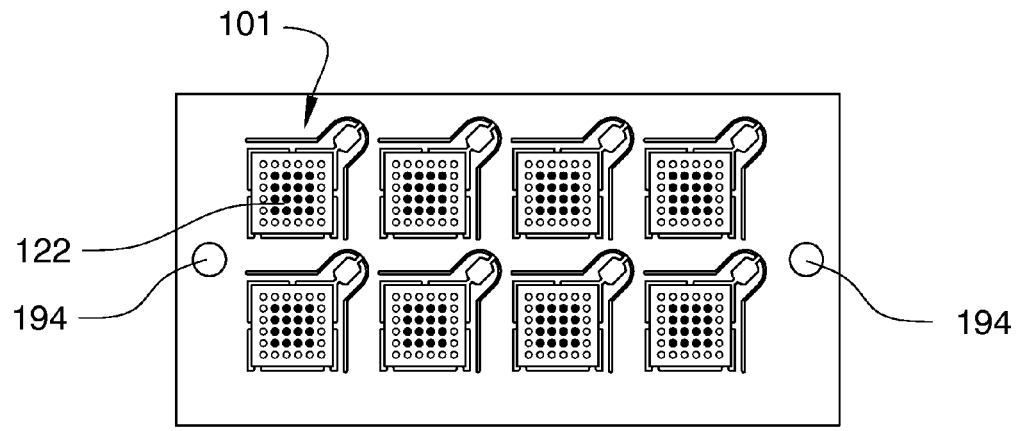
FIGS. 3A-3C are top views of carriers for holding microelectronic devices that are fabricated in accordance with one or more embodiments, each carrier being shown as adapted to hold a specific type of device.
Figure 3B:
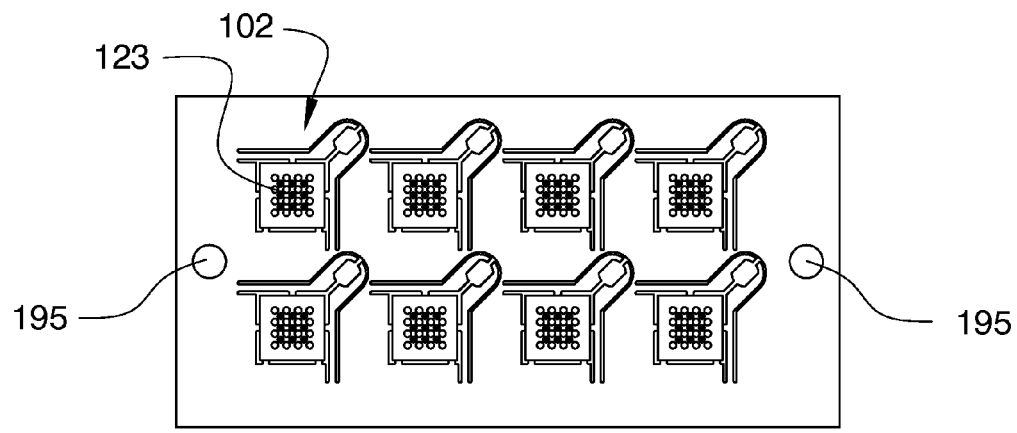
Figure 3C:
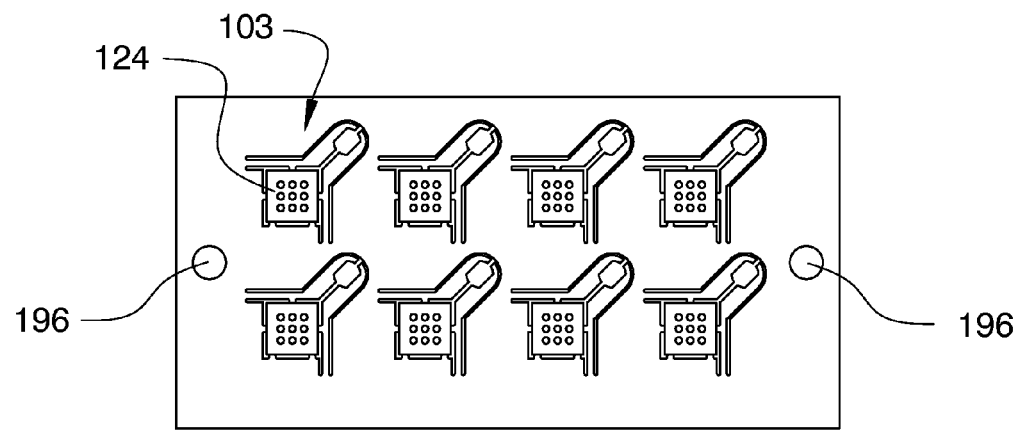

FIGS. 3A-3C are top views of precision carriers 197, 198 and 199 for holding devices that is fabricated in accordance with one or more embodiments. FIGS. 3A-3C show precision carriers 197, 198, and 199 holding chips 122, 123 and 124 in sites 101, 102 and 103, respectively, with the chips being held in each aperture which is in a closed configuration. Carriers 197, 198 and 199 are adapted to hold a specific type of device. For clarity of exposition, numerical labeling of the elements of each site is omitted as having been described in detail above with respect to FIGS. 1A to 2B. As further shown in FIGS. 3A-3C, carriers 197, 198 and 199 include alignment features 194, 195 and 196, respectively, that may be used to align the respective carriers to a mating element such as, for example and without limitation, a test socket, or a burn-in socket.

Figure 4:
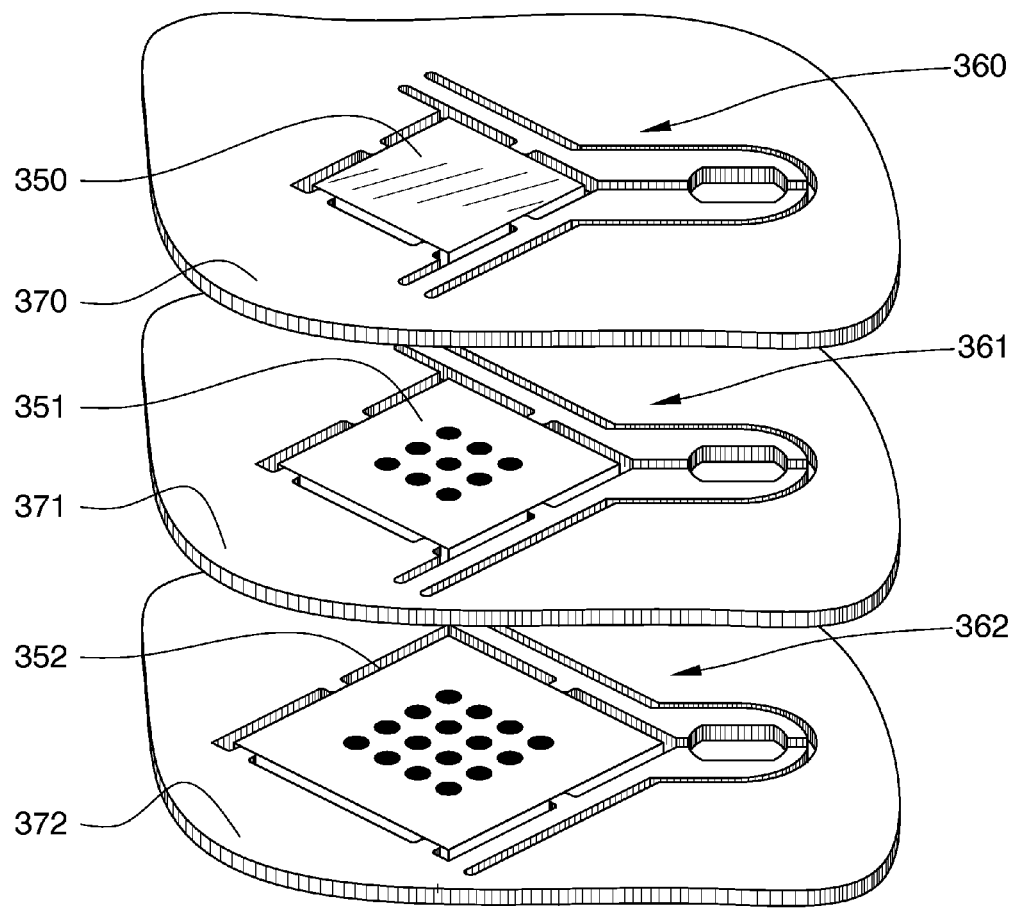
FIG. 4 is a perspective view of three devices held in juxtaposed sites of corresponding precision carriers in accordance with one or more embodiments.

FIG. 4 is a perspective view of three devices 350, 351 and 352 held in juxtaposed sites 360, 361 and 362 of corresponding precision carriers 370, 372 and 372, respectively, in accordance with one or more embodiments. As shown in FIG. 4, each of the sites in the precisions carriers is juxtaposed to the corresponding other sites, and each of the sites holds a different type of device. As will be described below, in accordance with one or more embodiments, the devices may be joined to form an assembly comprising a stack of devices for the purpose of testing or burning in the assembly. In accordance with one or more such embodiments, each device is releasably held by its edges in the carrier so as to allow access to top and bottom surfaces of the device for joining without impediment.

Figure 5B:
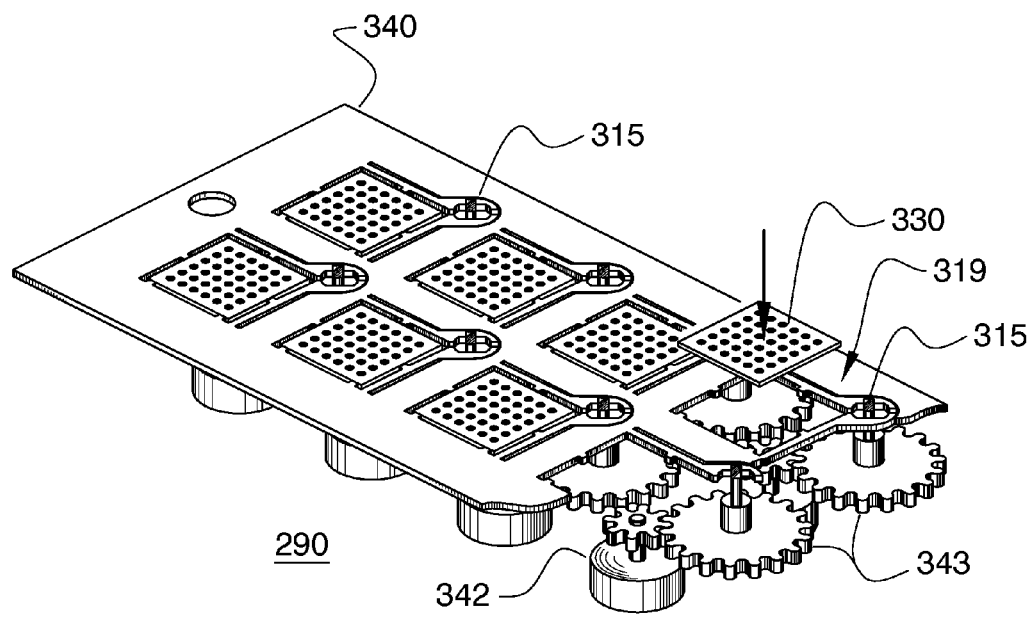
FIGS. 5A and 5B are cutaway perspective views of a precision carrier for holding microelectronic devices along with an apparatus for opening and closing sites in the carrier that are fabricated in accordance with one or more embodiments, the precision carrier being shown in a closed configuration for holding a device, and in an open configuration for receiving a device, respectively.
Figure 5A:
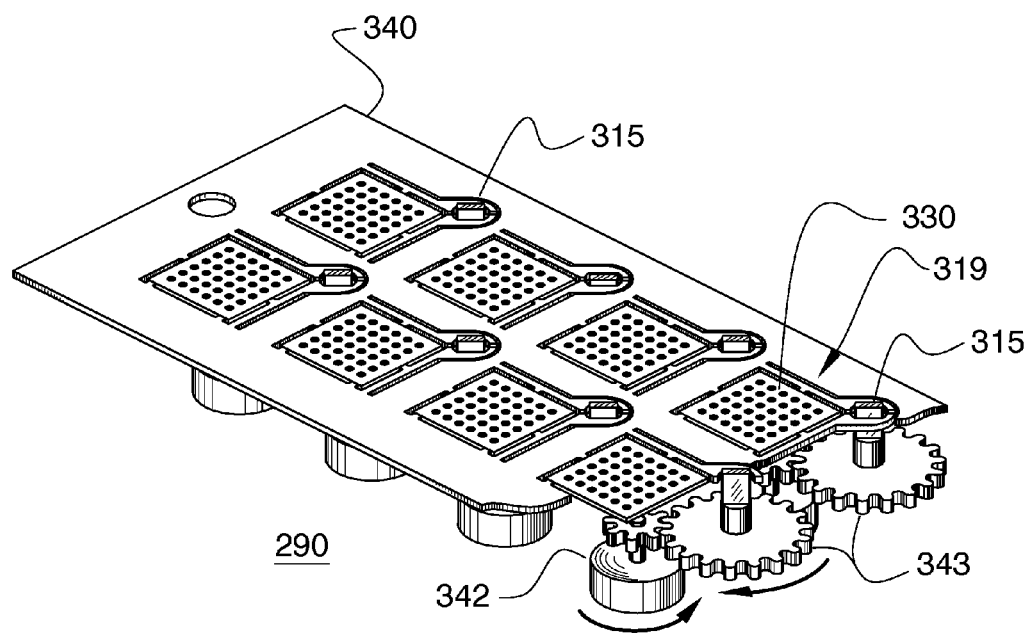

FIGS. 5A and 5B are cutaway perspective views of precision carrier 340 for holding microelectronic devices 330 by their edges in sites 319, along with apparatus 290 for opening and closing sites in precision carrier 340 that are fabricated in accordance with one or more embodiments. Precision carrier 340 is shown in a closed configuration for holding a device, and in an open configuration for receiving or removing a device in FIGS. 5A and 5B, respectively. As shown in FIGS. 5A and 5B, apparatus 290 has movable cams (for example, movable cam 315) that are adapted, and spaced appropriately apart from each other, to be disposed between actuating edges of two prongs at the various sites 319 in carrier 340. In FIG. 5A, the movable cams (for example, movable cam 315) are shown to be disposed so that the carrier sites are in a closed configuration so that chips (for example, chip 330) are held in the sites by their edges, and in FIG. 5B, the movable cams (for example, movable cam 315) are shown after movement (for example and without limitation, by rotation) to be disposed so that the carrier sites are in an open configuration so that chips may be inserted (for example, chip 330) or removed from carrier 340. As shown in FIGS. 5A and 5B, apparatus comprises one or more rotational motors 342 for rotating cams (for example, cam 315) by means of gears 343. In accordance with one or more embodiments, apparatus 290 is moved upwardly by a stepper motor drive (not shown) that is affixed to apparatus 290 and serves to insert the cams between, and to retract the cams to be clear of, respectively, the actuating edges at the carrier sites. In addition, in accordance with one or more further embodiments, apparatus 290 comprises a first stepper motor affixed to the cams for inserting the cams between, and for retracting the cams to be clear of, respectively, actuating edges at a carrier site, and a second stepper motor for moving the cams along a direction while the cams are disposed between the actuating edges so that such movement causes a distance between the actuating edges to change. In further addition, in accordance with one or more further embodiments, apparatus 290 comprises a first stepper motor affixed to the cams for inserting the cams between, and for retracting the cams to be clear of, respectively, the actuating edges, and a second stepper motor for moving the cams, and more particularly, portions of the cams, in directions so that such movement causes a distance between the actuating edges to change.

Figure 6A:
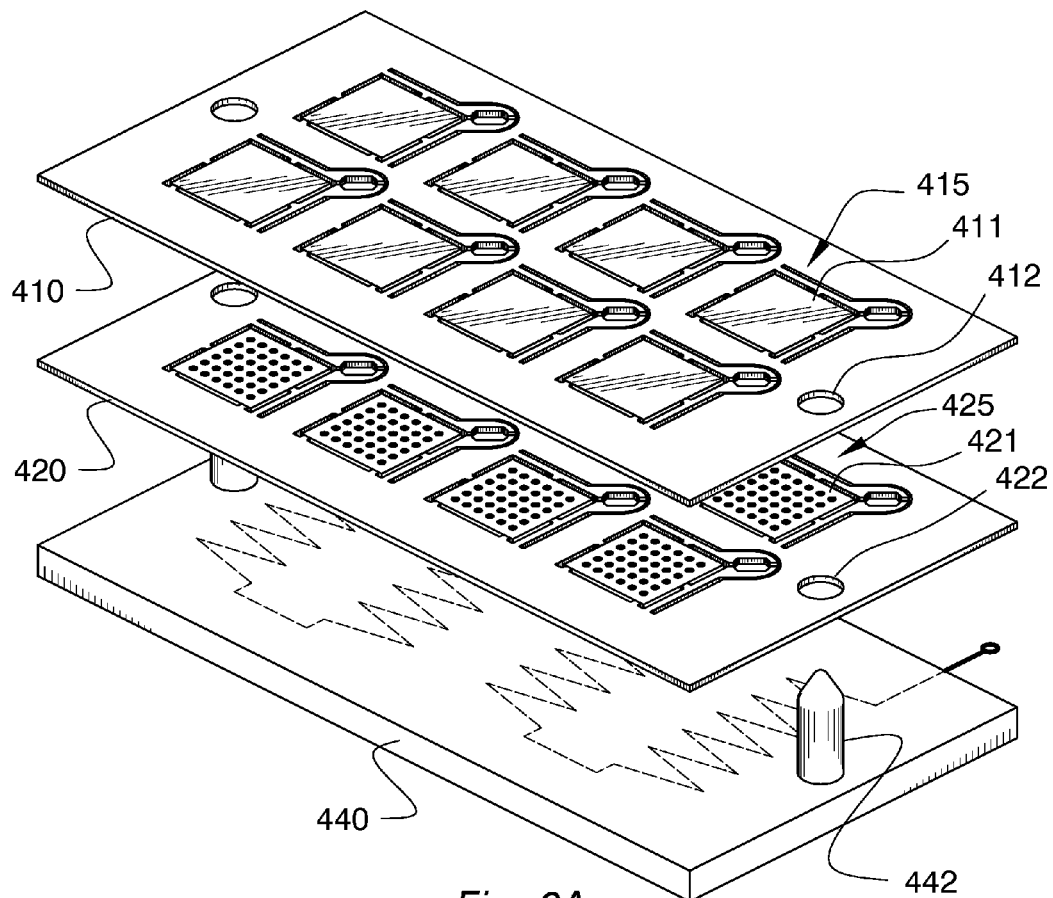
FIGS. 6A and 6B are perspective views of two precision carriers for holding microelectronic devices that are fabricated in accordance with one or more embodiments; the carriers being shown in juxtaposed registration over a heater platen, and in juxtaposed contact for joining the stacked devices, respectively.
Figure 6B:
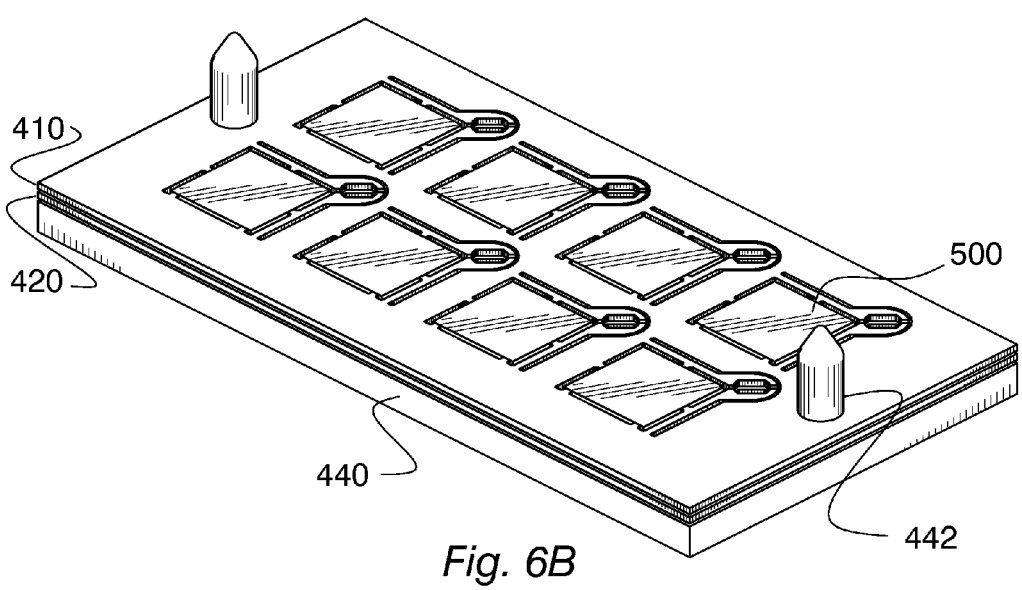

FIGS. 6A and 6B are perspective views of two precision carriers 410 and 420 for holding microelectronic devices that are fabricated in accordance with one or more embodiments; the carriers being shown in juxtaposed registration over heater platen 440, and in juxtaposed contact for joining devices 411 and 421, respectively, to form a stacked device 500. As shown in FIG. 6A, carriers 410 and 420 include alignment features 412 and 422, for example and without limitation, apertures, that are adapted to mate with mating elements 442, for example and without limitation, posts, affixed to heater platen 440. As seen in FIG. 6B, and in accordance with one or more embodiments, when carriers 410 and 420 are brought into contact, a stacked assembly of devices 500 is formed at each of the carrier sites 415 and 425 that contain devices. In addition, and as further seen in FIG. 6B, carriers 410 and 420 are registered to heating platen 440 by mating elements 412 (for example, posts) of heating platen 440 being mated with alignment features 412 and 422 of carriers 410 and 420, respectively (for example, by having the posts inserted into the apertures). Juxtaposed devices 411 and 421 are joined to form stacked device 500 that is held in place at sites 415 and 425 within carriers 410 and 420, respectively. As those of ordinary skill in the art can readily appreciate, carriers 410 and 420 may be registered to testing equipment by a similar mechanism, and carriers 410 and 420 may be registered to testing equipment which, like the carriers, is registered to a heating platen, for example, and without limitation, by use of the mating elements.

Figure 7A:
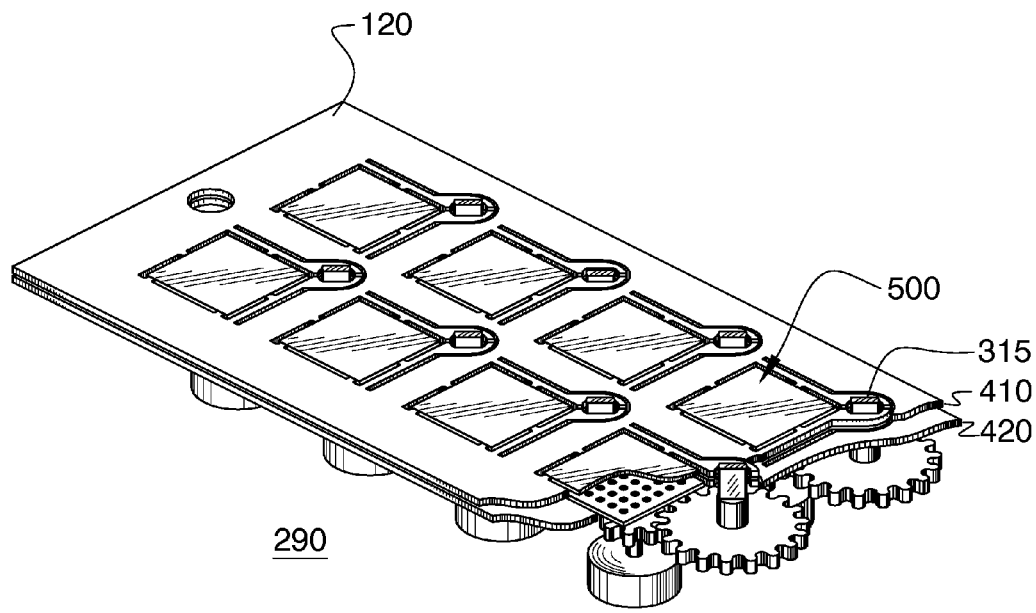
FIGS. 7A and 7B are cutaway perspective views of two stacked precision carriers for holding microelectronic devices by their edges along with an apparatus for opening and closing sites in the stacked carriers that are fabricated in accordance with one or more embodiments; the stacked carriers being shown juxtaposed in a closed position where each of the carriers holds one device in a joined stack of devices at each site, and juxtaposed in an open configuration wherein the joined stack of devices is released from the carriers, respectively.
Figure 7B:
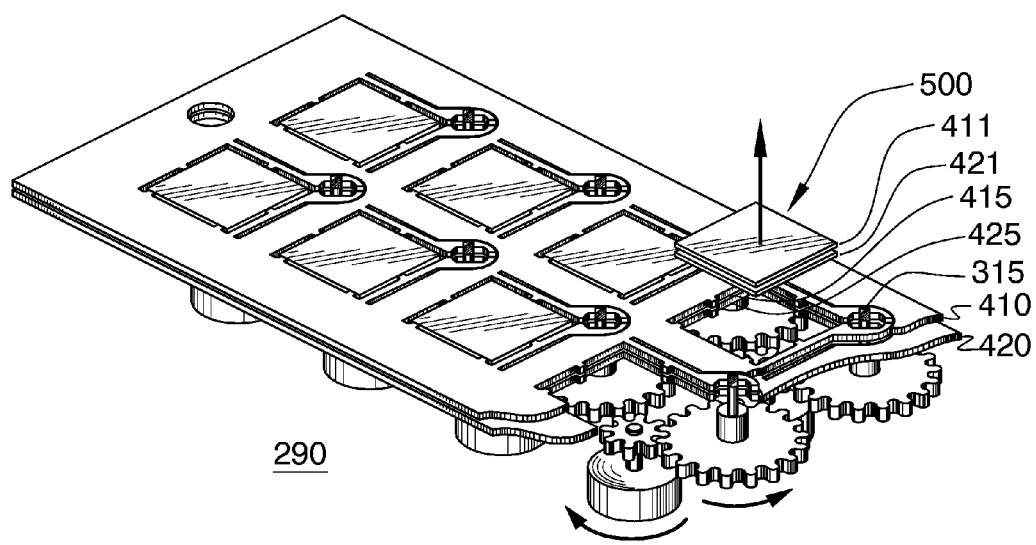

FIGS. 7A and 7B are cutaway perspective views of two precision carriers 410 and 420 for holding microelectronic devices 411 and 421, respectively, by their edges along with apparatus 290 for opening and closing sites 415 and 425 in the stacked carriers that are fabricated in accordance with one or more embodiments. FIG. 7A shows carriers 410 and 420 juxtaposed in a stack, where sites 415 and 425 are in a closed configuration. FIG. 7B shows carriers 410 and 420 juxtaposed in a stack, where each of the carriers holds one device in a joined stack of devices at each site, and juxtaposed in an open configuration wherein the joined stack of devices is released from the carriers, respectively. The embodiment shown in FIGS. 7A and 7B operates in a manner similar to that described above for a single precision carrier described above in conjunction with FIGS. 4A and 4B. However, in this case, the devices in each carrier are inserted into a carrier using the embodiment shown and described above in conjunction with FIGS. 5A and 5B. Then, carriers 410 and 420 are conjoined to form a joined stack of devices 411 and 421 using, for example and without limitation, a fixture having mating elements like those described above in conjunction with FIGS. 6A and 6B. Joining of devices 411 to devices 421 is accomplished by thermocompression bonding, soldering (for example and without limitation, by solder reflow), transient liquid phase bonding, brazing, or any one of a number of joining methods that are well known to those of ordinary skill in the art. Next, conjoined carriers 410 and 420 may be moved onto apparatus 290 so that cams 315 may be inserted between actuating edges at the sites as described above in conjunction with FIGS. 5A and 5B, except that here, cams 315 extend between the actuating edges of both carriers 410 and 420. As shown in FIG. 7B, movable cams 315 are shown after movement (for example and without limitation, by rotation) to be disposed so that carrier sites in both carriers are in an open configuration. Then, as shown in FIG. 7B, a joined stack of devices 500 may be removed from a site in the carriers using any one of a number of methods that are well known to those of ordinary skill in the art (for example and without limitation, using a vacuum picker) while cam 315 holds the site in an open configuration.

Embodiments described above are exemplary. As such, many changes and modifications may be made to the description set forth above by those of ordinary skill in the art while remaining within the scope of the invention. In addition, materials, methods, and mechanisms suitable for fabricating embodiments have been described above by providing specific, non-limiting examples and/or by relying on the knowledge of one of ordinary skill in the art. Materials, methods, and mechanisms suitable for fabricating various embodiments or portions of various embodiments described above have not been repeated, for sake of brevity, wherever it should be well understood by those of ordinary skill in the art that the various embodiments or portions of the various embodiments could be fabricated utilizing the same or similar previously described materials, methods, or mechanisms. As such, the scope of the invention should be determined with reference to the appended claims along with their full scope of equivalents.

What is claimed is:

1. A method for joining microelectronic devices to form a stack, which method comprises:
    providing:
    (a) a first and second planar carrier, wherein (i) each carrier includes one or more sites having a resilient aperture bounded in part by flat springs resilient in a plane of the carrier, (ii) each of the resilient apertures of each carrier is adapted to be opened by flexing the springs so an area of each of the resilient apertures is increased, whereby a microelectronic device may be inserted into or released from each of the resilient apertures; (iii) each of the resilient apertures of each carrier is adapted to be closed by enabling the springs to relax so the area of each of the resilient apertures is decreased, whereby the microelectronic device may be held in each of the resilient apertures by the springs urging against edges of the device, (iv) each carrier includes alignment features, and (v) at least one of the resilient apertures in the first carrier is adapted to be aligned with at least one of the resilient apertures in the second carrier when the first and second carriers are registered; and
    (b) an open-close mechanism adapted to cause the springs of the resilient apertures of one or both of the carriers to flex, thereby opening the resilient apertures of one or both of the carriers and adapted to allow the springs of the resilient apertures of one or both of the carriers to relax;
    flexing the springs of the resilient aperture at one of the one or more sites in the first carrier utilizing the open-close mechanism, inserting a first device in the resilient aperture, and enabling the springs to relax utilizing the open-close mechanism, thereby holding the first device in the resilient aperture by the springs urging against edges of the first device;
    flexing the springs of the resilient aperture at one of the one or more sites in the second carrier utilizing the open-close mechanism, inserting a second device in the resilient aperture, and enabling the springs to relax utilizing the open-close mechanism, thereby holding the second device in the resilient aperture by the springs urging against edges of the second device, wherein the resilient aperture at the one of the one or more sites in the first carrier is aligned with the resilient aperture at the one of the one or more sites in the second carrier when the first and second carriers are registered;

registering the first and second carriers by mating the alignment features of the first and second carriers with mating elements of an equipment;

contacting and joining the first and second devices to form a stack;

opening the resilient aperture at the one of the one or more sites in the first carrier and the resilient aperture at the one of the one or more sites in the second carrier by flexing the springs of the resilient aperture at the one of the one or more sites in the first carrier and the resilient aperture at the one of the one or more sites in the second carrier utilizing the open-close mechanism; and removing the stack.

2. The method of claim 1 wherein joining comprises thermo-compression bonding.

3. The method of claim 1 wherein joining comprises soldering.

4. The method of claim 1 wherein the open-close mechanism includes a rotatable cam.

5. The method of claim 1 wherein the first planar carrier comprises a sheet of stainless steel with apertures disposed in an array therein.

6. The method of claim 1 wherein:

the flat springs of each of the resilient apertures of the first carrier include ends that are juxtaposed to each other, which ends include a space therebetween;

the flat springs of each of the resilient apertures of the second carrier include ends that are juxtaposed to each other, which ends include a space therebetween; and the open-close mechanism includes rotatable cams, wherein the open-close mechanism is adapted so that one of the rotatable cams can be inserted into the space between the ends of the flat springs of each of the resilient apertures of the first or second carrier or of both carriers at the same time and the rotatable cams are adapted, in a first orientation to urge against the ends of the flat springs of each of the resilient apertures of the first or second carrier or of both carriers at the same time so the springs are flexed to open the resilient apertures of the first or second carrier or of both carriers at the same time, and in a second orientation to enable the ends to move towards each other so the springs are allowed to relax to close the resilient apertures of the first or second carrier or of both carriers at the same time.

7. The method of claim 1 wherein:

each of the flat springs of each of the resilient apertures of the first carrier includes an engagement mechanism;

each of the flat springs of each of the resilient apertures of the second carrier includes an engagement mechanism; and the open-close mechanism includes members, wherein the members are adapted so that one of the members can be placed into a first orientation to urge against the engagement mechanisms of the springs of each of the resilient apertures of the first or second carrier or both carriers at the same time so the springs are flexed to open the resilient apertures of the first or second carrier or of both carriers at the same time, and the members are adapted so that one of the members can be placed into a second orientation to enable the engagement mechanisms of the springs of each of the resilient apertures of the first or second carrier or of both carriers at the same time to move so that the springs are allowed to relax to close the resilient apertures of the first or second carrier or of both carriers at the same time.

8. The method of claim 1 wherein:

each of the flat springs of each of the resilient apertures of the first carrier includes an engagement mechanism;

each of the flat springs of each of the resilient apertures of the second carrier includes an engagement mechanism; and the open-close mechanism includes members, wherein the members are adapted so that one of the members can be moved to a first position to urge against the engagement mechanisms of the springs of each of the resilient apertures of the first or second carrier or both carriers at the same time so the springs are flexed to open the resilient apertures of the first or second carrier or of both carriers at the same time, and the members are adapted so that one of the members can be moved to a second position to enable the engagement mechanisms of the springs of each of the resilient apertures of the first or second carrier or of both carriers at the same time to move so that the springs are allowed to relax to close the resilient apertures of the first or second carrier or of both carriers at the same time.

* * * * *